United States Patent
Tanaka et al.

(10) Patent No.: US 8,841,615 B2
(45) Date of Patent: Sep. 23, 2014

(54) ELECTRON MICROSCOPE

(75) Inventors: Nobuo Tanaka, Nagoya (JP); Tsutomu Nakanishi, Nagoya (JP); Yoshikazu Takeda, Nagoya (JP); Hidefumi Asano, Nagoya (JP); Koh Saitoh, Nagoya (JP); Toru Ujihara, Nagoya (JP); Makoto Kuwahara, Nagoya (JP)

(73) Assignee: National University Corporation Nagoya University, Nagoya (JP)

( * ) Notice: Subject to any disclaimer, the term of this patent is extended or adjusted under 35 U.S.C. 154(b) by 196 days.

(21) Appl. No.: 13/637,227

(22) PCT Filed: Feb. 22, 2011

(86) PCT No.: PCT/JP2011/053790
§ 371 (c)(1),
(2), (4) Date: Sep. 25, 2012

(87) PCT Pub. No.: WO2011/122171
PCT Pub. Date: Oct. 6, 2011

(65) Prior Publication Data
US 2013/0009058 A1 Jan. 10, 2013

(30) Foreign Application Priority Data

Mar. 29, 2010 (JP) ................................ 2010-074008

(51) Int. Cl.
*H01J 37/26* (2006.01)
*H01J 37/073* (2006.01)

(52) U.S. Cl.
CPC ....... *H01J 37/26* (2013.01); *H01J 2237/06383* (2013.01); *H01J 2237/06333* (2013.01); *H01J 37/073* (2013.01); *H01J 2237/24557* (2013.01)
USPC ...................................................... 250/311

(58) Field of Classification Search
CPC ....... H01J 37/252; H01J 37/26; H01J 37/261; H01J 37/263; H01J 37/265; H01J 37/266; H01J 37/295; H01J 49/0004; H01J 49/284; H01J 49/286; H01J 2237/05; H01J 2237/06383; H01J 2237/24564; H01J 2237/25; H01J 2237/2588; H01J 2237/26; H01J 2237/2617; G01N 23/04
See application file for complete search history.

(56) References Cited

U.S. PATENT DOCUMENTS 5,834,791 A * 11/1998 Nakanishi et al. ............... 257/11
7,755,046 B2 * 7/2010 Kohashi et al. ............... 250/311

(Continued)

FOREIGN PATENT DOCUMENTS

| JP | A-60-105152 | 6/1985 |
| JP | A-08-240697 | 9/1996 |

(Continued)

OTHER PUBLICATIONS

Yamamoto et al., "High Brightness and High Polarization Electron Source Using Transmission Photocathode with GaAs-GaAsP Superlattice Layers," *Journal of Applied Physics*, Mar. 20, 2008, vol. 103, No. 6, pp. 64905-1-64905-7.

(Continued)

*Primary Examiner* — Jack Berman
(74) *Attorney, Agent, or Firm* — Oliff PLC (57) ABSTRACT

An electron microscope which utilizes a polarized electron beam and can obtain a high contrast image of a sample is provided. The microscope includes: a laser; a polarization apparatus that polarizes a laser beam into a circularly polarized laser beam; a semiconductor photocathode that is provided with a strained superlattice semiconductor layer and generates a polarized electron beam when irradiated with the circularly polarized laser beam; a transmission electron microscope that utilizes the polarized electron beam; an electron beam intensity distribution recording apparatus arranged at a face reached by the polarized electron beam that has transmitted through the sample. An electron beam intensity distribution recording apparatus records an intensity distribution before and after the polarization of the electron beam is reversed, and a difference acquisition apparatus calculates a difference therebetween.

9 Claims, 4 Drawing Sheets

(56) References Cited

U.S. PATENT DOCUMENTS

| | | |
|---|---|---|
| 2008/0210868 A1 | 9/2008 | Kohashi et al. |
| 2011/0089397 A1 | 4/2011 | Ujihara et al. |

FOREIGN PATENT DOCUMENTS

| | | |
|---|---|---|
| JP | A-2001-006601 | 1/2001 |
| JP | A-2007-258119 | 10/2007 |
| JP | A-2008-218063 | 9/2008 |
| JP | A-2009-266809 | 11/2009 |
| JP | A-2010-003450 | 1/2010 |

OTHER PUBLICATIONS

Dec. 18, 2013 Extended European Search Report issued in European Application No. 11762411.4.

Nakanishi, Tsutomu, "Application of Spin Polarized Electrons for Electron Microscopes," *Kenbikyo*, vol. 44, No. 2, pp. 103-110, 2009.

Sato et al., "Inverse Photoemission Spectroscopy," *Journal of the Surface Science Society of Japan*, vol. 29, No. 2, pp. 114-119, 2008 (With English-language Abstract).

Nakanishi, Tsutomu, "High Spin Polarization and High Brightness Electron Source," *Journal of the Surface Science Society of Japan*, vol. 29, No. 11, pp. 672-681, 2008 (With English-language Abstract).

Nakanishi, Tsutomu, "Spin Henkyoku Denshi Beam-gen no Kaihatsu," *Genshikaku Kenkyu*, vol. 46, No. 1, pp. 5-23, 2001.

Bauer, Ernst, "Spin-polarized Low Energy Electron Microscopy," *Handbook of Magnetism and Advanced Magnetic Materials*, 2007.

Written Opinion of the International Searching Authority Issued in Application No. PCT/JP2011/053790; Dated May 2, 2011 (With Partial Translation).

Written Opinion of the International Preliminary Examination Authority Issued in Application No. PCT/JP2011/053790; Dated Mar. 6, 2011 (With Partial Translation).

International Preliminary Report on Patentability Issued in Application No. PCT/JP2011/053790; Dated May 10, 2012 (With Translation).

International Search Report issued in Application No. PCT/JP2011/053790; Dated May 24, 2011 (With Translation).

\* cited by examiner

ELECTRON MICROSCOPE

TECHNICAL FIELD

The present application claims priority to Japanese Patent Application No. 2010-74008 filed on Mar. 29, 2010. The entire content disclosed in the description and drawings of this application is incorporated by reference into the present application.

The present invention relates to an electron microscope having the following features.
(1) An electron beam of which polarization of spin is high is used,
(2) An intensity distribution of an electron beam that transmitted through a sample is provided as an observation result, which is easy to be analyzed.
(3) An image exhibiting high contrast is provided based on the difference between the observation result obtained by up spin and the observation result obtained by down spin.

In "Embodiments", an electron microscope that uses an electron beam having almost 100% polarization is disclosed. Further, an electron microscope in which high S/N ratio is implemented using a pulse of a polarized electron beam is taught. Further, an electron microscope, provided with an electron beam rotating apparatus that rotates a traveling direction of the polarized electron beam without dispersing the spin direction of the polarized electron beam, is disclosed. Further, an electron microscope provided with a converging lens system which does not influence the spin direction of the polarized electron beam is described. Furthermore, an electron microscope provided with a spin direction rotating lens system that rotates the spin direction without influencing the converging degree of the polarized electron beam is introduced.

DESCRIPTION OF RELATED ART

An electron microscope that uses an electron beam of which spin direction is polarized is disclosed in Japanese Patent Application Laid-Open Publication No. 2008-218063. When the polarized electron beam is used, a molecular structure of a protein, and a magnetic domain structure of a magnetic substance, for example, can be observed.

BRIEF SUMMARY OF INVENTION

With an ordinary method based on the prior art of irradiating the polarized electron beam onto the sample and measuring the intensity distribution of the electron beam that transmitted through the sample, an image of which contrast is high enough to indicate useful knowledge on a substance cannot be obtained.

According to a technique disclosed in Japanese Patent Application Laid-Open Publication No. 2008-218063, interference fringes are generated using a biprism, and the molecular structure and the magnetic domain structure are clarified by analyzing the interference fringes. The technique intends to obtain a significant result by combining a polarized electron beam and electron beam holographic technology.

However interference fringes are also influenced by many factors other than the molecular structure and the magnetic domain structure, such as a phase of an incident electron beam, and the processing to clarify the molecular structure and the magnetic domain structure based on the interference fringes requires very difficult control of experimental conditions and complicated theories.

This description teaches a technique that can provide an intensity distribution of an electron beam that transmitted through a sample, that is, an image of an electron beam that transmitted through the sample, so that the observation result can be easily analyzed. With the prior art, an image with high contrast cannot be obtained based on the intensity distribution of the electron beam that passed through the sample because polarization of the polarized electron beam is low. Hence in this technology, a semiconductor photocathode having a strained superlattice semiconductor layer and generating an electron beam having high polarization is combined with a technique to utilize the difference between the observation result obtained by the up spin and the observation result obtained by the down spin. By using the combination of the semiconductor photocathode having the strained superlattice semiconductor layer and a technique to determine the difference between the spin directions, an image having high contrast can be provided.

In this description, a transmission electron microscope, that uses an electron beam of which spin direction is polarized and of which polarized spin direction reverses over time, is proposed. In this description, an electron beam of which spin direction is polarized is referred to as a polarized electron beam. An electron beam of which polarized spin direction reverses over time is referred to as a reversed polarized electron beam.

The transmission electron microscope proposed in this description is provided with a laser; a polarization apparatus that polarizes a laser beam generated by the laser into a circularly polarized laser beam and that is capable of reversing the direction of the circular polarization over time; a semiconductor photocathode that is provided with a strained superlattice semiconductor layer and generates a polarized electron beam when irradiated with the circularly polarized laser beam polarized by the polarization apparatus (hereafter simply referred to as a "semiconductor photocathode"); a transmission electron microscope that utilizes the polarized electron beam generated by the semiconductor photocathode; an electron beam intensity distribution recording apparatus that is arranged at a face reached by the polarized electron beam that has transmitted through a sample; a reversal instruction apparatus; and a difference acquisition apparatus. The reversal instruction apparatus sends a signal to the polarization apparatus to reverse the direction of the circular polarization, and also sends in synchronization therewith a signal to the electron beam intensity distribution recording apparatus. The difference acquisition apparatus calculates a difference between: an electron beam intensity distribution recorded by the electron beam intensity distribution recording apparatus before the reversal instruction apparatus sends the signal; and an electron beam intensity distribution recorded by the electron beam intensity distribution recording apparatus after the reversal instruction apparatus sends the signal.

The semiconductor photocathode provided with the strained superlattice semiconductor layer generates a polarized electron beam when irradiated with the circularly polarized laser beam. When the polarizing direction of the circularly polarized laser beam irradiating the semiconductor photocathode is reversed, the spin direction of the polarized electron beam reverses. In other words, the polarized electron beam reverses between a state where the up spin is dominant and a state where the down spin is dominant. The polarization of the polarized electron beam generated by the strained superlattice semiconductor layer is high, and if this polarized electron beam is used in combination with a technology to display the difference thereof, an electron beam image with high contrast can be provided.

The signal to reverse the polarizing direction of the circularly polarized laser beam is also transferred to the electron beam intensity distribution recording apparatus. The electron beam intensity distribution recording apparatus records the electron beam intensity distribution before the signal is sent and the electron beam intensity distribution after the signal is sent. In other words, the electron beam intensity distribution recording apparatus captures an image obtained in a state where the up spin is dominant, and an image obtained in a state where the down spin is dominant. The difference acquisition apparatus determines the difference of these images, and outputs this difference. An image that indicates the difference between the image obtained in the state where the up spin is dominant at high polarization and the image obtained in the state where the down spin is dominant at high polarization has high contrast, and helps the user to recognize the significant area. In other words, a clear image which can easily be analyzed is obtained.

It is preferable that the laser generates a pulsed laser beam.

When a pulsed laser beam is used, a pulsed polarized electron beam is generated. The pulsed polarized electron beam can confine the presence of the electron beam in a narrow time zone. If the pulsed polarized electron beam is used, background noise can be recognized in an image immediately before or immediately after irradiating the pulsed polarized electron beam to the sample. Thereby the influence of the background noise can be removed from the image generated by the pulsed polarized electron beam. Since background noise changes over time, it has a high value to use the pulsed polarized electron beam and to recognize the background noise immediately before or immediately after irradiating the pulsed polarized electron beam. Furthermore, if a cyclic pulsed polarized electron beam is used, an image with high S/N ratio can be obtained based on a principle similar to a lock-in amplifier. Comparing a pulsed-polarized electron beam and a continuous-polarized electron beam, the pulsed-polarized electron beam increases the intensity of the electron beam during irradiation of the electron beam, if an average intensity of the electron beam during a time of a plurality of pulses is the same. Therefore a clearer image can be obtained by the pulsed-polarized electron beam. Damage to a sample, on the other hand, depends on the average intensity of the electron beam during the time of the plurality of pulses. If the pulsed polarized electron beam is used, a clear electron beam image can be obtained while suppressing damage to the sample.

Thus the S/N ratio can be improved by using the pulsed polarized electron beam. Furthermore, a spectroscope result which allows a highly accurate calculation of an energy loss generated by the sample can be obtained when the pulsed polarized electron beam is dispersed by energy.

It is preferable that the semiconductor photocathode generates a pulsed polarized electron beam of which spin direction reverses in each pulse.

In this case, the time interval of the pulsed polarized electron beam can be decreased to a hundred picosecond order, and an image in the up spin state and an image in the down spin state can be captured at a hundred picosecond order interval. For example, a dynamic change in an energy band related to the magnetism of a metal can be detected separately for the up spin state and for the down spin state.

It is also significant to insert a splitter between the laser and the polarization apparatus. In this case, one of laser beams split by the splitter enters the polarization apparatus, and the other one of laser beams split by the splitter irradiates onto the sample. The laser beam which entered the polarization apparatus generates a polarized electron beam, and the laser beam that irradiates onto the sample excites the sample.

According to this method, a so called "pump probe measurement" is possible. In other words, the sample is irradiated with the laser beam and excited, and the sample in the excitation state can be observed and compared for the up spin state and for the down spin state. Thereby the dynamic change of the magnetic vector in the magnetic domain, due to optical pumping, can also be measured.

A spectroscope that applies a magnetic field and/or an electric field to the electron beam that has transmitted through the sample may be added. The spectroscope refracts the orbit of the electron beam, whereby the electron beam is dispersed depending on energy, This allows observing and comparing the spectroscopic analysis result obtained in the up spin state, and the spectroscopic analysis result obtained in the down spin state. Furthermore, the energy state of the up spin and the energy state of the down spin in the sample can be measured respectively. A dynamic change in the energy state can also be measured. For example, the dynamic change of the energy band related to the magnetism of a metal can be detected separately in the up spin state and in the down spin state.

The spectroscope is a kind of electron beam intensity recording apparatus that is arranged at a face reached by the polarized electron beam that has transmitted through the sample, and the spectroscopic result is a kind of electron beam intensity distribution.

It is also effective to add an electron beam rotating apparatus that applies both a magnetic field and an electric field between the semiconductor photocathode and the transmission electron microscope, so as to rotate a travelling direction of the polarized electron beam. It is possible to rotate the travelling direction of the polarized electron beam by applying only a magnetic field, or only an electric field, but in this case, the magnetic field or the electric field influences the spin direction of the polarized electron beam. If the travelling direction of the polarized electron beam is rotated by applying only the magnetic field or only the electric field, the spin direction of the polarized electron beam is dispersed.

Whereas if both the magnetic field and the electric field are applied, a relationship for a force of the electric field rotating the spin direction and for a force of the magnetic field rotating the spin direction to cancel each other out can be obtained, and the spin direction of the polarized electron beam dispersing while rotating the travelling direction of the polarized electron beam can be prevented. Therefore the travelling direction of the polarized electron beam can be rotated while maintaining high polarization.

One embodiment of the electron beam rotating apparatus is provided with a pair of electrodes, a pair of coils, a voltage regulator, a current regulator and a setting unit. Each pair of electrodes is a spherical condenser type electrode having a partial spherical shape, of which center is the center of orbit of the polarized electron beam. The pair of coils is arranged facing each other. The voltage regulator adjusts the voltage to be applied between the pair of electrodes, and the current regulator adjusts the current to be supplied to the pair of coils. The setting unit sets a voltage adjustment value of the voltage regulator and the current adjustment value of the current regulator, so that a relationship is established for a force of the electric field rotating the spin direction and a force of the magnetic field rotating the spin direction to cancel each other out.

The transmission electron microscope may be provided with a plurality of converging lenses. If the converging lens rotates the spin direction of the polarized electron beam, it becomes difficult to set the relationship of the sample and the spin direction to a desired relationship. Therefore it is preferable that each of the converging lenses is constituted by a double gap lens provided with a pair of coils that generates magnetic fields, of which directions are opposite and intensities are the same, in the magnetic field components for rotating the spin direction of the polarized electron beam.

When the double cap lens is used, the spin direction does not change even if the converging lens is adjusted to adjust the degree of convergence. This makes it easier to set the relationship of the sample and the spin direction to a desired relationship.

It is also preferable to install a spin direction rotating lens that generates a magnetic field at a position where the polarized electron beam converges by the converging lens in the former stage. By adjusting the spin direction rotating lens, the relationship of the sample and the spin direction can be easily set to a desired relationship.

According to the transmission electron microscope disclosed in this description, an image to indicate a difference of an image obtained in the up spin state and an image obtained in the down spin state can be generated, hence a clear image of a substance structure and a magnetic domain structure, that interacts with the polarized electron beam, can be obtained.

In the field of magnetic recording material technology, a magnetic domain size decreases as the density becomes progressively higher, but an effective technology to observe the refined magnetic domain structure is not available at the moment. According to the transmission electron microscope disclosed in this description, the magnetic domain structure can be observed in nanometer level resolutions. The present invention can contribute to promoting the development of magnetic recording material, for example.

DETAILED DESCRIPTION OF INVENTION

Technical characteristics of an embodiment to be described below are as follows.
(Characteristic 1) A polarization apparatus has a linear polariscope that polarizes a laser beam into a linearly polarized light, a phase modulator that modulates a phase of the linearly polarized laser beam, and a λ/4 phase modulation plate.
(Characteristic 2) A reversal instruction apparatus has a transmission apparatus that instructs a phase modulation timing to the phase modulator.
(Characteristic 3) The time width of the pulsed polarized electron beam can be set to 100 picoseconds or less.
(Characteristic 4) The time interval of the pulsed polarized electron beam can be set to several hundred picoseconds or less.
(Characteristic 5) The direction of spin reverses in each pulse of the pulsed polarized electron beam.
(Characteristic 6) The direction of spin reverses in every plurality of pulses of the pulsed polarized electron beam.
(Characteristic 7) Three types of images are provided: an image obtained in the up spin state, an image obtained in the down spin state, and an image indicating a difference thereof.
(Characteristic 8) A required image can be selected from the three types of images.

Embodiment

Figure 1:
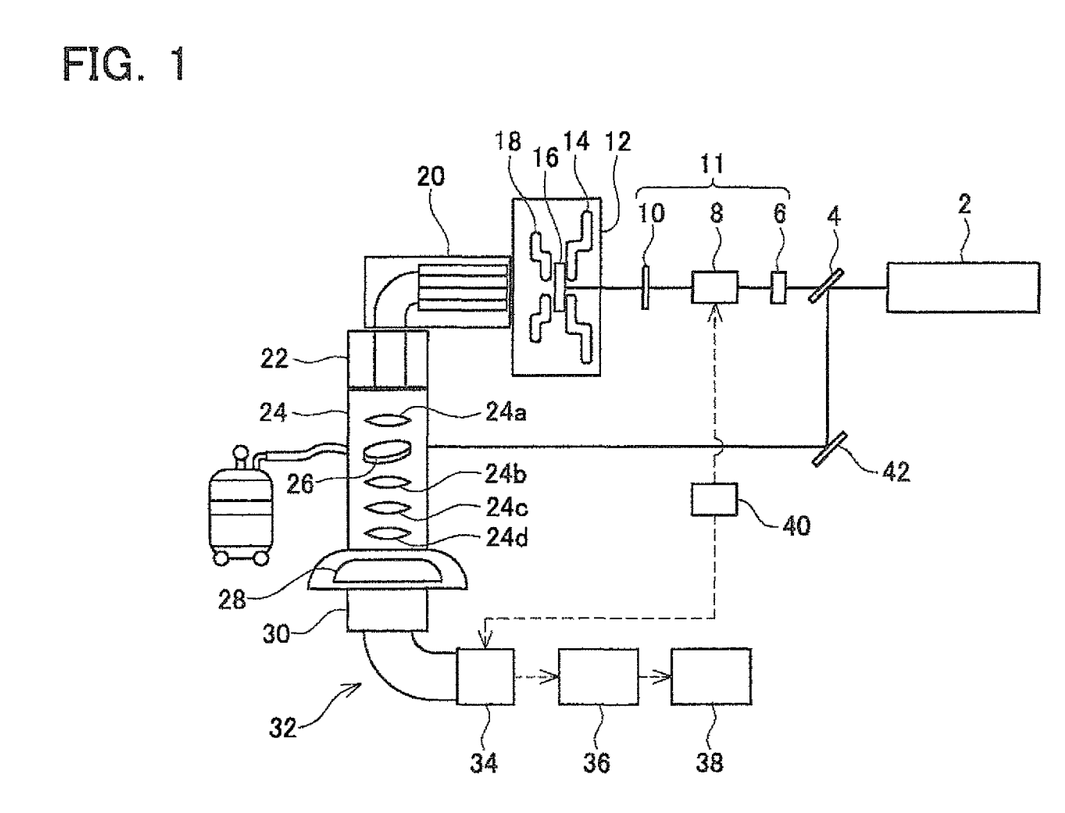
FIG. 1 is a diagram depicting a configuration of an electron microscope of an embodiment.

FIG. 1 is a schematic diagram depicting a configuration of a transmission electron microscope according to an embodiment. A reference number 2 denotes a laser. A laser beam generated by the laser 2 enters a polarization apparatus 11. The polarization apparatus 11 is provided with a linear polariscope 6, a phase modulator 8 and a λ/4 phase modulation plate 10. The phase modulator 8 is connected to a reversal instruction apparatus 40, and the reversal instruction apparatus 40 instructs a phase modulation amount to the phase modulator 8. The reversal instruction apparatus 40 instructs one of two types of phase modulation amounts. If one of the phase modulation amounts is instructed, a laser beam, which is circularly polarized in the right direction, is emitted from the λ/4 phase modulation plate 10, and if the other phase modulation amount is instructed, a laser beam, which is circularly polarized in the left direction is emitted from the λ/4 phase modulation plate 10. The polarization apparatus 11 polarizes a laser beam generated by the laser 2 into a circularly polarized laser beam, and can reverse the direction of the circular polarization over time. The reversal instruction apparatus 40 sends the polarization apparatus 11 a signal to reverse the direction of the circular polarization over time by switching the two types of phase modulation amounts. The reversal instruction apparatus 40 is provided with a transmission apparatus that instructs a phase modulation timing to the phase modulator 8.

The circularly polarized laser beam, which was polarized by the polarization apparatus 11, irradiates a right face of a semiconductor photocathode 16 supported by a holder 14 of a polarized electron beam generating apparatus 12. Then the semiconductor photocathode 16 generates a polarized electron beam from a left face. The polarized electron beam here refers to an electron beam in which one of a number of electrons in the up spin state and a number of electrons in the down spin state is dominant over the other, and the spin direction of the electron is polarized.

The semiconductor photocathode 16 is provided with a strained superlattice semiconductor layer. When the polarizing direction of the circularly polarized laser beam, which irradiates the strained superlattice, is reversed, the spin direction of the polarized electron beam generated from the semiconductor photocathode 16 reverses. When the polarization apparatus 11 reverses the direction of the circular polarization, the spin direction of the polarized electron beam generated by the semiconductor photocathode 16 reverses.

Details on the polarized electron beam generating apparatus 12 are disclosed in Japanese Patent Application Laid-Open Publication No. 2007-258119, hence redundant description is omitted here. The electron beam generated by the polarized electron beam generating apparatus 12 that utilizes the strained superlattice semiconductor layer has high polarization, and if this highly polarized electron beam is used in combination with a technology to utilize the difference, an image having high contrast regarding the intensity distribution of an electron beam, that has transmitted through the sample, can be obtained.

The polarized electron beam generated from the semiconductor photocathode 16 is led to an anode electrode 18, travels to the left in FIG. 1, and enters a magnetic field-electric field superimposed type electron beam rotating apparatus 20. The magnetic field-electric field superimposed type electron beam rotating apparatus 20 changes a traveling direction of the electron beam 90°, so that the electron beam travels downward. An electron beam that enters the magnetic field-electric field superimposed type electron beam rotating apparatus 20 has a spin in the traveling direction or a spin in the opposite direction of the traveling direction. The magnetic field-electric field superimposed type electron beam rotating apparatus 20 does not changes the spin direction of the polarized electron beam. As a result, an electron emitted from the magnetic field-electric field superimposed type electron beam rotating apparatus 20 has a spin in a direction vertical to the traveling direction. For a later mentioned sample, a structure on a plane vertical to the traveling direction of the polarized electron beam is often observed. Therefore it is advantageous to utilize the polarized electron beam having a spin in a direction vertical to the traveling direction.

Figure 2:
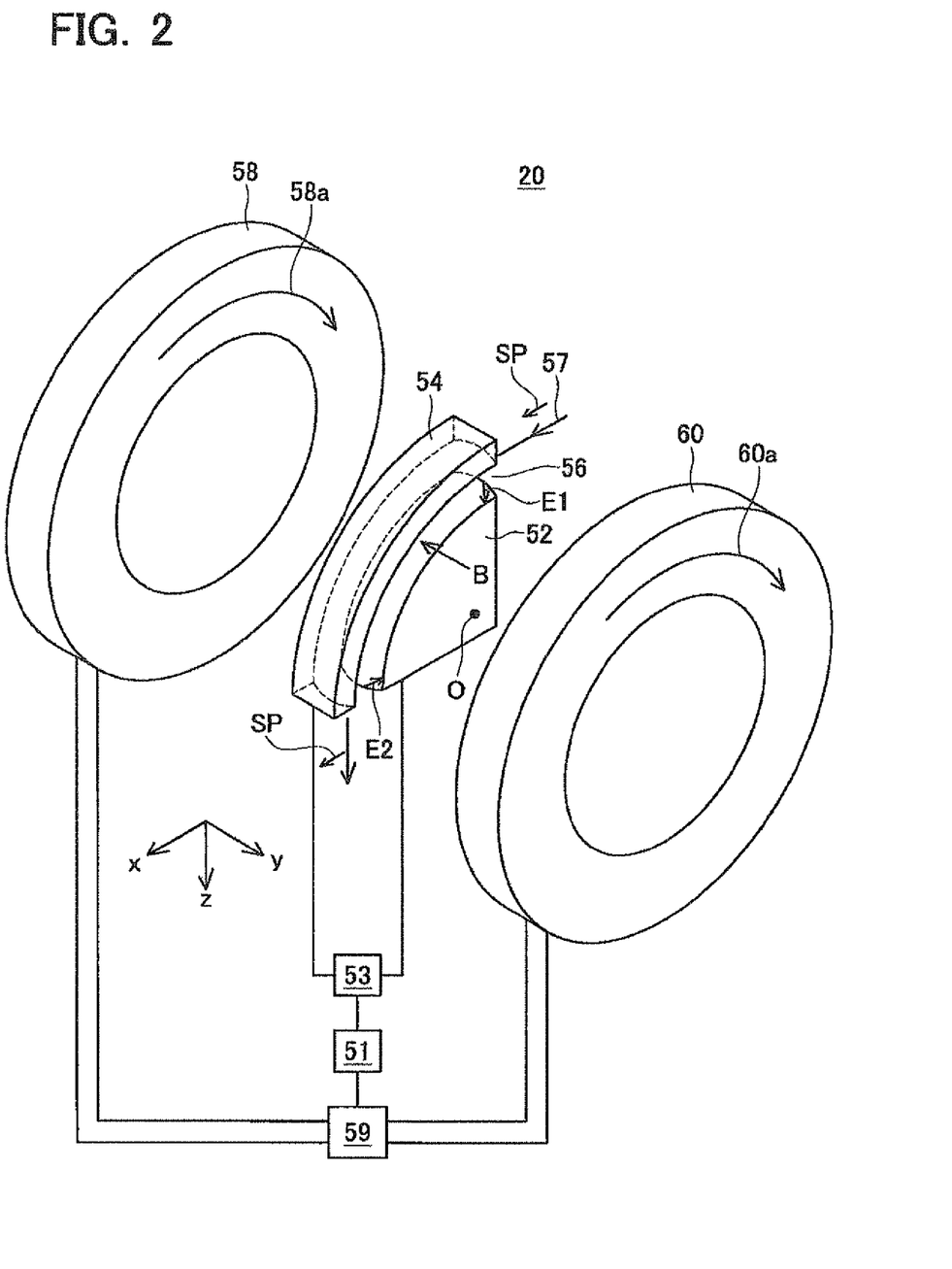
FIG. 2 is an exploded perspective view of a magnetic field-electric field superimposed type electron beam rotating apparatus.

FIG. 2 is an exploded perspective view of the electron beam rotating apparatus 20. The electron beam rotating apparatus 20 has an inner electrode 52 and an outer electrode 54. The inner electrode 52 is a plate of which shape is ¼ of a disk, and the outer circumferential surface has a partial spherical shape of which center is an origin O. The origin O is also a center of the inner electrode 52 in the thickness direction. The inner circumferential surface of the outer electrode 54 also has a partial spherical shape of which center is the origin O. A gap 56 where a polarized electron beam 57 travels is formed between the outer circumferential surface of the inner electrode 52 and the inner circumferential surface of the outer electrode 54. Electrostatic voltage is applied between the inner electrode 52 and the outer electrode 54 by a voltage regulator 53. Positive voltage is applied to the inner electrode 52. Electric fields E1 and E2 directed to the origin O are applied to the gap 56. A force directed to the origin O is applied to an electron that travels in the gap 56. By this force, the traveling direction of the polarized electron beam 57 is rotated.

The electron beam traveling direction rotating apparatus 20 has a pair of coils 58 and 60 which face each other, sandwiching the inner electrode 52 and the outer electrode 54. The pair of coils 58 and 60 has coils extending in arrow directions 58a and 60a respectively, and current supplied to each coil is adjusted by a current regulator 59. If the current regulator 59 supplies current to the pair of coils 58 and 60, a magnetic field B is generated in the gap 56, and the size of the magnetic field is changed depending on the current value. The magnetic field generated in the gap 56 also applies a force directed to the origin O on an electron traveling in the gap 56. By this force, the traveling direction of the polarized electron beam 57 is rotated.

If the velocity of the polarized electron beam 57 is slow, the electric field E does not rotate the spin direction of a polarized electron beam 57. However in the case of the electron microscope of this example, a relativistic effect appears and the electric field E rotates the spin direction, since the speed of the polarized electron beam 57 is fast. The electric field E rotates the spin direction in the x-y plane illustrated in FIG. 2. The magnetic field B also rotates the spin direction in the x-y plane.

The setting unit 51 sets voltage (V) to be applied between the inner electrode 52 and the outer electrode 54 and the current (I) to be supplied to the pair of coils 58 and 60 to values that satisfy the following relationships.

(1) A force for the electric field E generated by the voltage V to refract the traveling direction of an electron+a force for the magnetic field B generated by the current I to refract the traveling direction of the electron=a force for making the polarized electron beam 57 to proceed along the gap 56. As a result, the polarized electron beam 57 that traveled in the x direction and entered the electron beam rotating apparatus 20, is rotated in the traveling direction by the electron beam rotating apparatus 20, and is emitted from the electron beam rotating apparatus 20 in the z direction. The center O of the partial spherical shape of the inner electrode 52 and the outer electrode 54 becomes the center of the orbit of the polarized electron beam 57.

(2) A force for the electric field E generated by the voltage V to rotate the spin direction of the polarized electron beam+a force for the magnetic field B generated by the current T to rotate the spin direction of the polarized electron beam=zero (that is, the forces cancel each other out).

Figure 3:
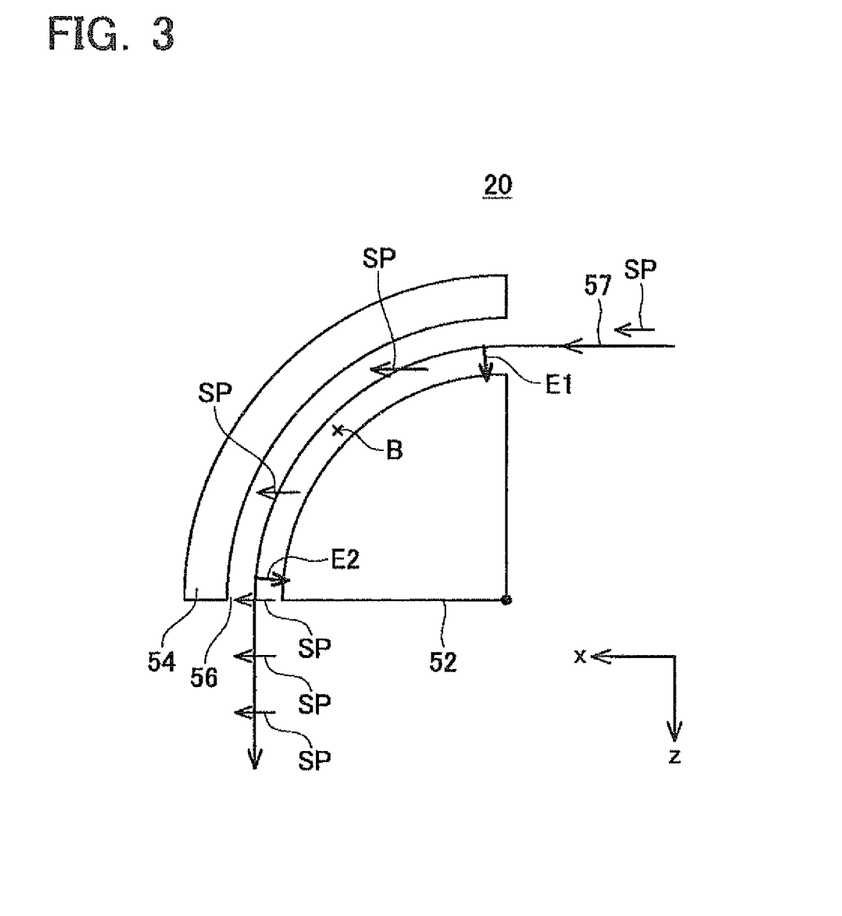
FIG. 3 is a diagram depicting a relationship between the electron beam travelling direction and the spin direction in the electron beam rotating apparatus.

In the case of the electron microscope of this example, rotation of the spin direction in the electron beam rotating apparatus 20 is prevented by utilizing the above relationships. FIG. 3 is a schematic diagram depicting a state of the traveling direction of the polarized electron beam 57 rotating in the electron beam rotating apparatus 20, and a state of the spin direction (indicated by a short arrow SP) that is maintained. According to the electron beam traveling direction rotating apparatus 20 of this example, the spin direction of the polarized electron beam is not disposed while rotating the traveling direction of the polarized electron beam 57.

Furthermore, the polarized electron beam is not dispersed if the traveling direction of the polarized electron beam is rotated by using both the magnetic field and the electric field.

By adjusting the electric field and the magnetic field, the spin direction can be changed in the plane perpendicular to the traveling direction of the electron beam traveling downward in FIG. 1 (z direction in FIG. 2), that is, the spin direction can be changed within a horizontal plane (x-y plane in FIG. 2). The spin direction can also be changed by the electron beam rotating apparatus 20, so that the spin direction is reversed between the up spin state and the down spin state. However it takes time to reverse the spin direction by the electron beam rotating apparatus 20, and reversing the spin direction at a speed of several hundred milliseconds or less is impossible. According to this example, the phase modulator 8 reverses the up spin state and the down spin state. The phase modulator 8 can switch the phase at a speed of several hundred picoseconds or less, and the spin direction of the polarized electron beam can be reversed at a several hundred picoseconds or less interval. The electron microscope in FIG. 1 can reverse the spin direction at a dominantly higher speed than the method of reversing the spin direction by the electron beam rotating apparatus 20. In the case of this example, the capability of rotating the spin direction by the electron beam rotating apparatus 20 is used to prevent the spin direction from rotating in the electron beam rotating apparatus 20.

As FIG. 1 illustrates, a focusing lens group 24a, a sample lens 24b, an intermediate lens 24c and a projection lens 24d are arranged in a lens barrel of the electron microscope 24. A sample 26 is disposed between the focusing lens group 24a and the sample lens 24b. The sample 26 can be cooled by liquid helium.

Figure 4:
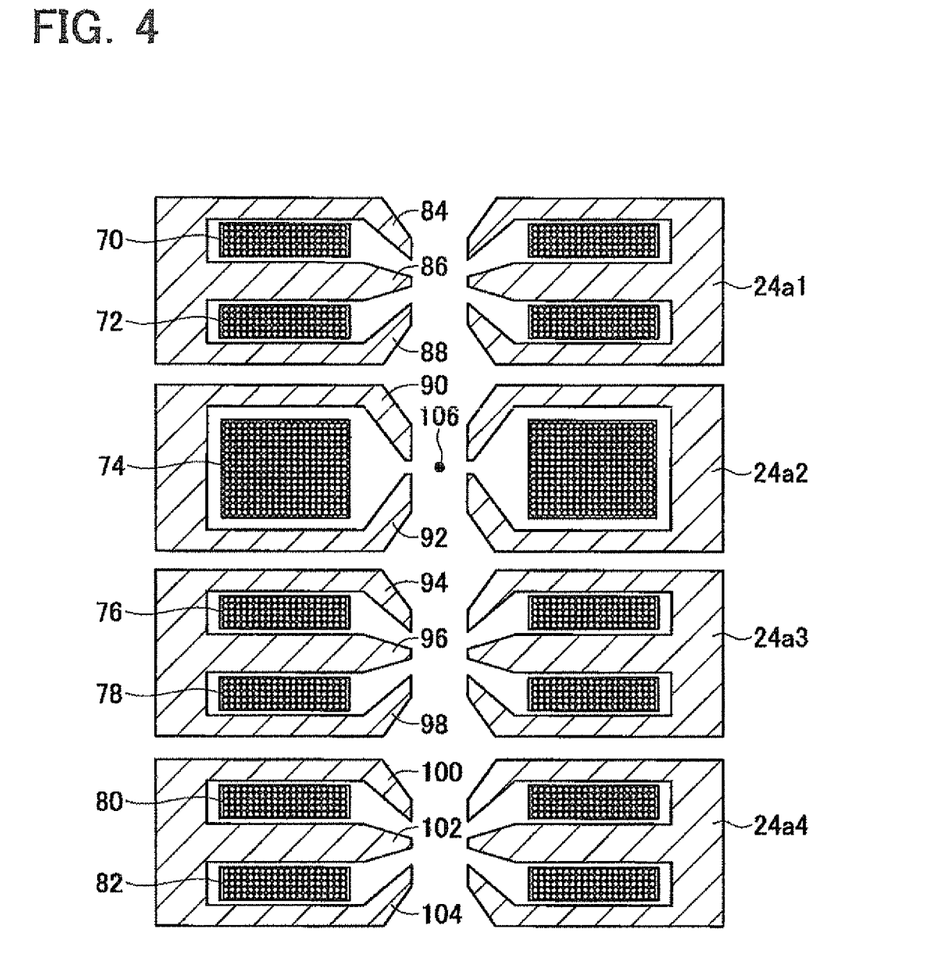
FIG. 4 is a diagram depicting a configuration of a converging lens group in the electron microscope.

As FIG. 4 illustrates, the focusing lens group 24a is constituted by a first converging lens 24a1, a spin direction rotating lens 24a2, a second converging lens 24a3, and a third converging lens 24a4.

The first converging lens 24a1 is provided with coils 70 and 72 which are arranged vertically in two steps, and yokes 84, 86 and 88, and if a magnetic field component that rotates the spin direction of the polarized electron beam is observed, the coils 70 and 72 generate magnetic fields of which directions are the opposite and intensities are the same. The first converging lens 24*a*1 is a double gap lens, and does not rotate the spin direction of the polarized electron beam. The polarized electron beam is converted at a position 106, without rotating the spin direction. A reference number 106 denotes a center position of the spin direction rotating lens 24*a*2. The function of the spin direction rotating lens 24*a*2 will be described later.

The second converging lens 24*a*3 is provided with coils 76 and 78 which are arranged vertically in two steps, and yokes 94, 96 and 98, and if a magnetic field component that rotates the spin direction of the polarized electron beam is observed, the coils 76 and 78 generates magnetic fields of which directions are the opposite and intensities are the same. The second converging lens 24*a*3 is a double gap lens, and does not rotate the spin direction of the polarized electron beam.

The third converging lens 24*a*4 is provided with coils 80 and 82 which are arranged vertically in two steps, and yokes 100, 102 and 104, and if a magnetic field component that rotates the spin direction of the polarized electro beam is observed, the coils 80 and 82 generate magnetic fields of which directions are the opposite and intensities are the same. The third converging lens 24*a*4 is a double gap lens, and does not rotate the spin direction of the polarized electron beam.

Since the first converging lens 24*a*1, the second converging lens 24*a*3 and the third converging lens 24*a*4 are double gap lenses respectively that do not rotate the spin direction, the relationship between the sample and the spin direction is not influenced even if the degree of convergence is adjusted by the first converging lens 24*a*1, the second converging lens 24*a*3 and the third converging lens 24*a*4. This makes it easier to set the relationship between the sample and the spin direction to a desired relationship.

The spin direction rotating lens 24*a*2 rotates the spin direction by applying the magnetic field to the polarized electron beam converged at the center position 106. In this case, the spin direction can be changed in the plane perpendicular to the traveling direction of the electron beam traveling downward (z direction in FIG. 2), that is, a horizontal plane (x-y plane in FIG. 2). If the spin direction rotating lens 24*a*2 is provided, the relationship between the sample and the spin direction can more easily be set to a desired relationship. Since the spin direction rotating lens 24*a*2 is for applying a magnetic field to the polarized electron beam converged at the center position 106, convergence of the polarized electron beam is not influenced even if the current value to be supplied to the coil 74 is changed. Reference numbers 90 and 92 denote yokes. The first converging lens 24*a*1, the second converging lens 24*a*3 and the third converging lens 24*a*4 for controlling convergence does not influence the spin direction of the polarized electron beam, and the spin direction rotating lens 24*a*2 for controlling the spin direction do not influence the degree of convergence. This makes it easier to set the observation conditions to desired conditions.

The electron beam which transmitted through the first converging lens 24*a*1, the spin direction rotating lens 24*a*2, the second converging lens 24*a*3, the third converging lens 24*a*4 illustrated in FIG. 4 and the sample 26 illustrated in FIG. 1 transmits through the sample lens 24*b*, the intermediate lens 24*c* and the projection lens 24*d* illustrated in FIG. 1, and enters an electron beam entrance apparatus 30. A reference number 28 denotes an observation window.

The electron beam that entered the electron beam entrance apparatus 30 is dispersed by a magnetic field deflection type energy spectroscope 32. The magnetic field deflection type energy spectroscope 32 refracts the traveling direction of the electron beam 90° by applying a magnetic field in a direction perpendicular to the traveling direction of the electron beam. The degree of this refraction is different depending on the energy of the electron. Spectroscopy can be performed by the energy of the electron, since this energy distribution generates a difference in the degree of refraction.

As disclosed in Japanese Patent Application Laid-Open Publication No. 2007-258119, the polarized electron beam generated by the polarized electron beam generating apparatus 12 has a narrow energy spread. In this example, the energy spread is 0.1 eV or less. By using the polarized electron beam of which energy spread is narrow in combination with an energy spectroscope, an electron energy loss spectroscopy (EELS) can be performed with high energy resolution.

An electron, of which traveling direction is refracted by the magnetic field deflection type energy spectroscope 32 reaches an imaging plane of an ultrasensitive CCD camera 34. The ultrasensitive CCD camera 34 has many image cells, and outputs a voltage for each cell in proportion to the intensity of an electron beam that reached the cell. Distribution of output voltages from the cells indicates an intensity distribution of the electron beam that reached the imaging plane. The CCD camera 34 stores the intensity distribution of the electron beam that reached the imaging plane (this intensity distribution represents the electron beam image).

The above mentioned reversal instruction apparatus 40 sends a synchronization signal to the CCD camera 34 in synchronization with switching a phase modulation amount to be instructed to the phase modulator 8. The CCD camera 34 separately records an electron beam intensity distribution captured before receiving the synchronization signal, and an electron beam intensity distribution captured after receiving the synchronization signal. In other words, the CCD camera 34 is an electron beam intensity distribution recording apparatus that can separately record an electron beam image obtained in the up spin state and an electron beam image obtained in the down spin state.

A difference acquisition apparatus 36 calculates a difference of the electron beam image in the up spin state and the electron beam image in the down spin state captured by the CCD camera 34. The calculation result is outputted to an output apparatus 38. The output apparatus 38 displays and records the image that indicates the difference between the electron beam image in the up spin state and the electron beam image in the down spin state. The output apparatus 38 also has a function to superimpose and display the obtained plurality of difference images, and to record the superimposed image of the plurality of difference images. Thereby the S/N ratio of the difference image dramatically improves compared with that of one difference image.

In an image outputted by the output apparatus 38, information related to the structure of the sample (spatial positional relationship) and information reflecting the level of energy of the electron transmitted through the sample are superimposed. This image can be explained using three-dimensional cube theory, and an image of the sample can be visualized based on an electron that lost energy. (Electron Beam Nano-imaging, Nobuo Tanaka, Uchida Rokakuho Publishing Co. Ltd.)

The laser beam generated by the laser 2 is a pulsed laser beam of which cycle is several hundred picoseconds, and the time width of each pulse can be decreased to a femtosecond. The semiconductor photocathode 16 generates a pulsed polarized electron beam of which cycle is several hundred picoseconds, and can decrease the time width of each pulse to several tens of picoseconds. The phase modulator 8 can switch a phase amount at a speed of several hundred picoseconds or less. Therefore the semiconductor photocathode 16 generates a pulsed polarized electron beam of which cycle is several hundred picoseconds, and a reversed polarized electron beam of which polarization direction reverses in each pulse. By changing an interval for the phase modulator 8 to switch the modulation amount, a number of pulses of the polarized electron beam, which are generated during the reversal of the polarization direction, can be set arbitrarily. Actively utilizing this arbitrary setting and theory of a lock-in amplifier, the S/N ratio of the image data can be improved dramatically compared with prior art.

If the pulsed polarized electron beam, of which cycle is several hundred picoseconds, is used, and a signal having the same frequency is input to an image analysis apparatus, only a signal that changes at the same frequency as this frequency can be extracted based on a theory similar to the lock-in amplifier. Various noises are mixed in an image that indicates a difference between an electron beam image obtained in the up spin state and an electron beam image obtained in the down spin state. If only an image that changes at a same frequency as the frequency of switching the up spin state and the down spin state is extracted, only the difference between the electron beam image obtained in the up spin state and the electron beam image obtained in the down spin state can be clearly extracted. As a result, a clear image free from the influence of noise can be obtained.

A reference number 4 denotes a splitter that splits a part of the laser beam generated by the laser 2, and irradiates the split laser beam onto the sample utilizing a mirror 42. The laser beam that irradiates onto the sample can be used for a light for exciting an internal state of a substance.

If an excitation light is used, an electron beam image of a sample, which is in a state excited by the laser beam, can be obtained. According to the electron microscope in FIG. 1, an electron beam image, that indicates a difference between an electron image obtained in the up spin state and an electron image obtained in the down spin state, can be obtained from a sample in the state excited by the laser beam. It has been possible to measure an energy state of up spin and down spin of a substance using a spin-resolved photoelectron spectroscopy apparatus (UPS). However prior art allows measuring only a static energy state. While the present technology makes a more advanced measurement possible, that is, makes it possible to dynamically measure the energy state of an excited substance.

The excitation light may be obtained from a source other than the laser 2. By synchronizing an excitation light generating apparatus and the laser 2, the excitation timing and the measurement timing can be synchronized. Here "synchronization" refers not only to simultaneous synchronization, but also to synchronization with creating a time difference. For the excitation light generating apparatus, a wavelength-variable pulsed laser beam regulating apparatus, for example, can be used.

In FIG. 1, the spectroscopic result using the magnetic field deflection type energy spectroscope 32 is captured by the CCD camera 34, but the CCD camera 34 may be disposed at the position of the electron beam entrance apparatus 30.

It is preferable to use the polarized electron beam generating apparatus 12 with $1\times10^{-9}$ Pa or less pressure, the electron beam traveling direction rotating apparatus 20 with $1\times10^{-8}$ Pa or less pressure, and set a pressure in the lens barrel of the transmission electron microscope 24 to $5\times10^{-8}$ Pa or less. It is even better to use the polarized electron beam generating apparatus 12 with $1\times10^{-10}$ Pa level pressure, the electron beam traveling direction rotating apparatus 20 with $1\times10^{-9}$ Pa level pressure, and to set the pressure in the lens barrel of the electron microscope 24 in a $1\times10^{-8}$ Pa to $5\times10^{-8}$ Pa range. Since the polarized electron beam generating apparatus 12 is used in a high vacuum state, intensity of an electron beam generated by the polarized electron beam generating apparatus 12 can be stabilized for a long period of time. This makes observation over a long period of time possible.

While embodiments of the present invention have been described in detail, such embodiments are merely illustrative and are not intended to limit the scope of the Claims. The techniques described in the scope of the Claims include various modifications and changes of the specific examples illustrated above.

It is to be understood that the technical elements described in the present description and the drawings exhibit technical usefulness solely or in various combinations thereof, and shall not be limited to the combinations described in the Claims at the time of filing. Furthermore, the techniques illustrated in the present description and the drawings are to achieve a plurality of objectives at the same time, whereby technical usefulness is exhibited by attaining any one of such objectives.

What is claimed is:

1. An electron microscope that uses an electron beam of which spin direction is polarized, and of which polarized spin direction reverses over time, comprising:
   a laser;
   a polarization apparatus that polarizes a laser beam generated by the laser into a circularly polarized laser beam and that is capable of reversing the direction of the circular polarization over time;
   a semiconductor photocathode that is provided with a strained superlattice semiconductor layer and generates a polarized electron beam of which spin direction is polarized, when irradiated with the circularly polarized laser beam polarized by the polarization apparatus;
   a transmission electron microscope that utilizes the polarized electron beam generated by the semiconductor photocathode;
   an electron beam intensity distribution recording apparatus that is arranged at a face reached by the polarized electron beam that has transmitted through a sample;
   a reversal instruction apparatus that sends a signal to the polarization apparatus to reverse the direction of the circular polarization, and also sends in synchronization therewith a signal to the electron beam intensity distribution recording apparatus; and
   a difference acquisition apparatus that calculates a difference between an electron beam intensity distribution recorded by the electron beam intensity distribution recording apparatus before the reversal instruction apparatus sends the signal, and an electron beam intensity distribution recorded by the electron beam intensity distribution recording apparatus after the reversal instruction apparatus sends the signal.

2. The electron microscope according to claim 1, wherein the laser generates a pulsed laser beam.

3. The electron microscope according to claim 2, wherein the semiconductor photocathode generates a pulsed polarized electron beam of which spin direction reverses in each pulse.

4. The electron microscope according to claim 1, wherein
   a splitter is inserted between the laser and the polarization apparatus,
   one of split laser beams split by the splitter enters the polarization apparatus, and
   the other one of split laser beams split by the splitter irradiates a sample.

5. The electron microscope according to claim 1, further comprising:
a spectroscope that applies a magnetic field and/or an electric field to the electron beam which has transmitted through the sample to refract the orbit of the electron beam, whereby the electron beam is dispersed depending on the energy.

6. The electron microscope according to claim 1, wherein:
the semiconductor photocathode comprises the strained superlattice semiconductor layer that generates a polarized electron beam of which spin direction is polarized along a traveling direction of the electron beam;
an electron beam rotating apparatus is provided between the semiconductor photocathode and the transmission electron microscope, wherein the electron beam rotating apparatus applies both a magnetic field and an electric field such that a force of the electric field for rotating the spin direction and a force of the magnetic field for rotating the spin direction is cancelled and a force of the electric field for refracting the traveling direction of the electron beam and a force of the magnetic field for refracting the traveling direction of the electron beam refract the electron beam 90°.

7. The electron microscope according to claim 6, wherein the electron beam rotating apparatus further comprises:
a pair of spherical condenser type electrodes having a partial spherical shape of which center is the center of the orbit of the polarized electron beam, and to which voltage is applied;
a pair of coils arranged to face each other;
a voltage regulator that adjusts voltage to be applied between the pair of electrodes;
a current regulator that adjusts the current to be supplied to the pair of coils; and
a setting unit that sets a voltage adjustment value of the voltage regulator and a current adjustment value of the current regulator so that a relationship is established for a force of the electric field rotating the spin direction and a force of the magnetic field rotating the spin direction to cancel each other out.

8. The electron microscope according to claim 1, wherein the transmission electron microscope comprises:
a plurality of converging lenses, each of the converging lenses comprising a double gap lens provided with a pair of coils that generates magnetic fields, of which directions are opposite and intensities are the same, in magnetic field components for rotating the spin direction of the polarized electron beam.

9. The electron microscope according to claim 1, further comprising:
a spin direction rotating lens that generates a magnetic field at a position where the polarized electron beam converges by the converging lens in a former stage.

* * * * *